(12) United States Patent
Williams et al.

(10) Patent No.: US 7,321,133 B2
(45) Date of Patent: Jan. 22, 2008

(54) HETEROATOMIC REGIOREGULAR POLY(3-SUBSTITUTEDTHIOPHENES) AS THIN FILM CONDUCTORS IN DIODES WHICH ARE NOT LIGHT EMITTING OR PHOTOVOLTAIC

(75) Inventors: Shawn P. Williams, Pittsburgh, PA (US); Troy D. Hammond, Pittsburg, PA (US); Darin W. Laird, Pittsburg, PA (US)

(73) Assignee: Plextronics, Inc., Pittsburgh, PA (US)

( * ) Notice: Subject to any disclaimer, the term of this patent is extended or adjusted under 35 U.S.C. 154(b) by 233 days.

(21) Appl. No.: 11/274,918

(22) Filed: Nov. 16, 2005

(65) Prior Publication Data

US 2006/0118901 A1 Jun. 8, 2006

Related U.S. Application Data

(60) Provisional application No. 60/628,202, filed on Nov. 17, 2004.

(51) Int. Cl.
*H01L 29/861* (2006.01)

(52) U.S. Cl. ......... 257/40; 257/E51.025; 257/E51.029; 257/E29.327; 257/E23.018; 257/E23.166; 257/E21.053; 257/E21.351

(58) Field of Classification Search ................. 257/40, 257/E51.025, E51.029, E51.03, E29.327, 257/E23.018, E23.166, E21.053, E21.351
See application file for complete search history.

(56) References Cited

U.S. PATENT DOCUMENTS

| | | | |
|---|---|---|---|
| 5,237,582 A | 8/1993 | Moses | |
| 6,025,462 A | 2/2000 | Wang et al. | |
| 6,124,046 A | 9/2000 | Jin et al. | |
| 6,150,668 A | 11/2000 | Bao et al. | |
| 6,165,383 A | 12/2000 | Chou | |
| 6,166,172 A | 12/2000 | McCullough et al. | |
| 6,197,663 B1 | 3/2001 | Chandross et al. | |
| 6,313,261 B1 | 11/2001 | Samuel et al. | |
| 6,340,789 B1 | 1/2002 | Petritsch et al. | |
| 6,361,885 B1 | 3/2002 | Chou | |
| 6,376,828 B1 | 4/2002 | Comiskey | |
| 6,384,804 B1 | 5/2002 | Dodabalapur et al. | |
| 6,403,809 B1 | 6/2002 | Holmes et al. | |
| 6,429,040 B1 | 8/2002 | Bao et al. | |
| 6,437,422 B1 | 8/2002 | Solomon et al. | |
| 6,468,759 B1 | 10/2002 | Charych | |

(Continued)

OTHER PUBLICATIONS

McCullough, et al., "Regioregular, Head-to-Tail Coupled Poly(3-alkythiophene) and its Derivatives," *Handbook of Conducting Polymers*, 2nd Ed., Chptr 9, pp. 225-258 (1998).

(Continued)

*Primary Examiner*—George Fourson
(74) *Attorney, Agent, or Firm*—Foley & Lardner LLP

(57) ABSTRACT

Regio-regular polythiophenes used in diodes which are not light emitting or photovoltaic. High quality, processable thin film polymer films can be made. The thin film can have a thickness of about 50 nm to about one micron, and the conductive thin film can be applied by spin casting, drop casting, screening, ink-jetting, transfer or roll coating. The polythiophenes can be homopolymers or copolymers. The regio-regular poly(3-substitutedthiophene) can be derivatized so that the 3-substituent is an alkyl, aryl, or alkyl/aryl moiety with a heteroatom substitution in either the α- or beta-position of the 3-substituent.

20 Claims, 6 Drawing Sheets

REGIO-REGULAR POLY(3-SUBSTITUTED THIOPHENE) WITH α and β POSITIONS OF THE 3-SUBSTITUENT INDICATED

U.S. PATENT DOCUMENTS

| | | |
|---|---|---|
| 6,506,438 B2 | 1/2003 | Duthaler et al. |
| 6,509,581 B1 | 1/2003 | Tsai et al. |
| 6,545,291 B1 | 4/2003 | Amundson et al. |
| 6,602,974 B1 | 8/2003 | McCullough et al. |
| 6,603,139 B1 | 8/2003 | Tessler et al. |
| 6,608,323 B2 | 8/2003 | Marks et al. |
| 6,626,566 B2 | 9/2003 | Holmes et al. |
| 6,676,857 B2 | 1/2004 | Heeney et al. |
| 6,736,985 B1 | 5/2004 | Bao et al. |
| 6,750,473 B2 | 6/2004 | Amundson et al. |
| 6,794,676 B2 | 9/2004 | Pakbaz et al. |
| 6,806,374 B2 | 10/2004 | Heeney et al. |
| 6,808,972 B2 | 10/2004 | Sirringhaus et al. |
| 2004/0119681 A1* | 6/2004 | Albert et al. ............... 345/107 |
| 2005/0110767 A1* | 5/2005 | Gomes et al. ............... 345/173 |
| 2006/0078761 A1* | 4/2006 | Williams et al. ............ 428/690 |
| 2006/0237695 A1* | 10/2006 | Williams et al. ............ 252/500 |
| 2007/0082140 A1* | 4/2007 | Suzuki et al. ............... 427/402 |
| 2007/0172978 A1* | 7/2007 | Chua et al. .................... 438/99 |

OTHER PUBLICATIONS

McCullough, R. D., "The Chemistry of Conducting Polythiophenes," *Adv. Mat.*, 10, No. 2, pp. 93-116 (1998).

Runyan, W. R. et al., *Handbook of Materials and Processes for Electronics* (1970).

Streetman, B. G., "Junctions," *Solid State Electronic Devices*, 4$^{th}$ Ed., Chptr. 5, pp. 130-200 (1995).

Streetman, B. G., "p-n Junctions Diodes" *Solid State Electronic Devices*, 4$^{th}$ Ed., Chptr 6 pp. 201-231 (1995).

Wiley, *The Encyclopedia of Polymer Science and Engineering*, pp. 298-300, (1990).

* cited by examiner

REGIO-REGULAR POLY(3-SUBSTITUTED
THIOPHENE) WITH α and β POSITIONS OF THE 3-SUBSTITUENT INDICATED POLY(3-[α-THIAHEPTYL]THIOPHENE), POLY(3-SUBSTITUTED THIOPHENE)
WITH α HETERO SUBSTITUTION POLY(3-[β-OXAHEPTYL]THIOPHENE), POLY(3-SUBSTITUTED THIOPHENE)
WITH β HETERO SUBSTITUTION POLY(3-[α,δ,ζ-TRIOXAOCTYL]THIOPHENE), POLY(3-SUBSTITUTED THIOPHENE)
WITH MULTIPLE HETERO ATOM SUBSTITUTIONS INCLUDING
AN α HETERO SUBSTITUTION POLY(3-[β,ε,θ-TRIOXANONYL]THIOPHENE), A POLY(3-SUBSTITUTED THIOPHENE)
WITH MULTIPLE HETERO ATOM SUBSTITUTIONS INCLUDING A β HETERO SUBSTITUTION SCHEMATIC REPRESENTATION OF DIFFERENT TYPES OF BLOCK COPOLYMERS INCLUDING (A) AB
TYPE COPOLYMER, AND (B) ABA TYPE COPOLYMER, OF REGIO-REGULAR POLY(3-SUBSTITUTED)THIOPHENES

HETEROATOMIC REGIOREGULAR POLY(3-SUBSTITUTEDTHIOPHENES) AS THIN FILM CONDUCTORS IN DIODES WHICH ARE NOT LIGHT EMITTING OR PHOTOVOLTAIC This application claims benefit of U.S. provisional application Ser. No. 60/628,202 filed Nov. 17, 2004 to Hammond et al. which is hereby incorporated by reference in its entirety including specification, claims, abstract, and figures.

BACKGROUND

Diodes generally function as an electronic version of a one-way valve. By restricting the direction of movement of charge carriers, it allows an electric current to flow in one direction, but blocks it in the other direction. Diodes can be used in, for example, radio demodulation, logic gates, power conversion, and over-voltage protection. Most modern diodes are based on semi-conductor p-n junctions. In a p-n diode, conventional current can flow from the p-doped side (the anode) to the n-doped side (the cathode), but not in the opposite direction. When the diode is reverse-biased, the charge carriers are pulled away from the center of the device, creating a depletion region.

A need exists to provide diodes which have improved performance characteristics. One approach which can be used is use of organic semiconducting materials including polymeric materials such as conducting polymers, or conjugated polymers, to tune the diode properties. However, some conducting polymers do not provide suitable processability and purity for device applications including diodes and are difficult to fabricate into thin films. Higher conductivity and tunability can be lacking in many materials.

In particular, improvements are needed in use of conducting polymers in diodes which are not light emitting diodes. Improvements are also needed in diodes which are not designed to be part of a photovoltaic cell.

SUMMARY

Regioregular polythiophene polymeric materials can be used to control the diode properties. Moreover, side group control can be used to provide desired properties. In particular, diodes are provided which are not designed to be light emitting or photovoltaic in nature.

Multiple embodiments are provided including, for example, a diode comprising a conductive thin film which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent. The diode can be non-light emitting. The diode can be designed not to have photovoltaic properties. The presence of the heteroatom substitution provides solubility during processing and contributes to stable doping of the oxidized or conductive form of the polymer and can aid in reducing the amount of metallic impurities present during processing.

One embodiment provide a diode comprising a conductive thin film which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent, wherein the diode does not provide electroluminescent or photovoltaic properties.

Another embodiment provides a diode comprising a p-type material and an n-type material, wherein the p-type material comprises a conductive thin film which comprises at least one polymer comprising a regio-regular poly(3-substitutedthiophene), wherein the diode is not a light-emitting diode.

Another embodiment provides a diode comprising a p-type material and an n-type material, wherein the p-type material comprises a conductive thin film which comprises at least one polymer comprising a regio-regular poly(3-substitutedthiophene), wherein the diode is not a photovoltaic diode.

A basic and novel feature of the invention is that the conducting polymer has metallic impurities at a level sufficiently low to allow for sustained performance. This can be difficult to achieve in many prior art systems.

BRIEF DESCRIPTION OF DRAWINGS

FIG. 6 illustrates block copolymers wherein a thiophene block is coupled with one or more other blocks to form a block copolymer.

DETAILED DESCRIPTION

Figure 1:
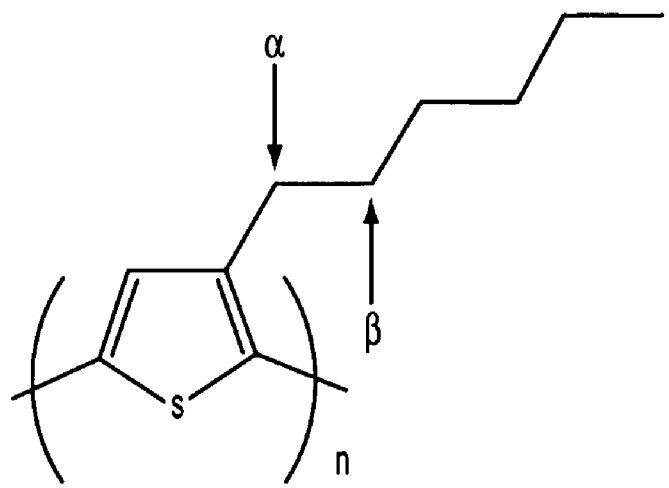
FIGS. 1-6 provide illustrations of structures and nomenclatures of preferred compounds according to the present invention, including the alpha and beta labeling in FIG. 1.
Figure 2:
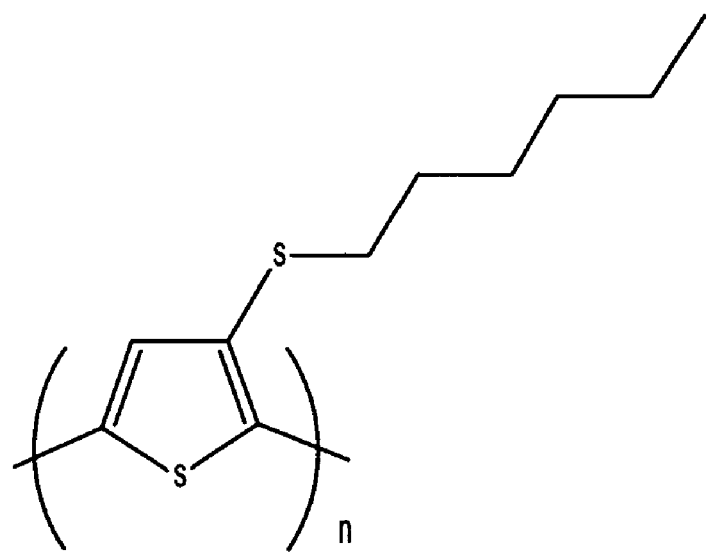
Figure 3:
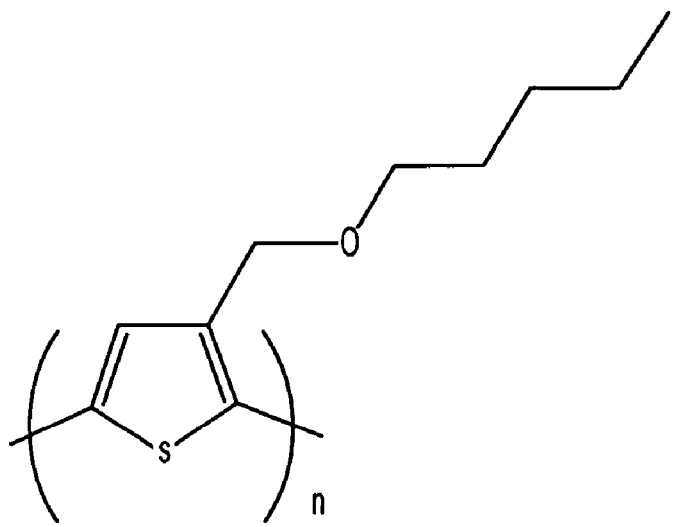
Figure 4:
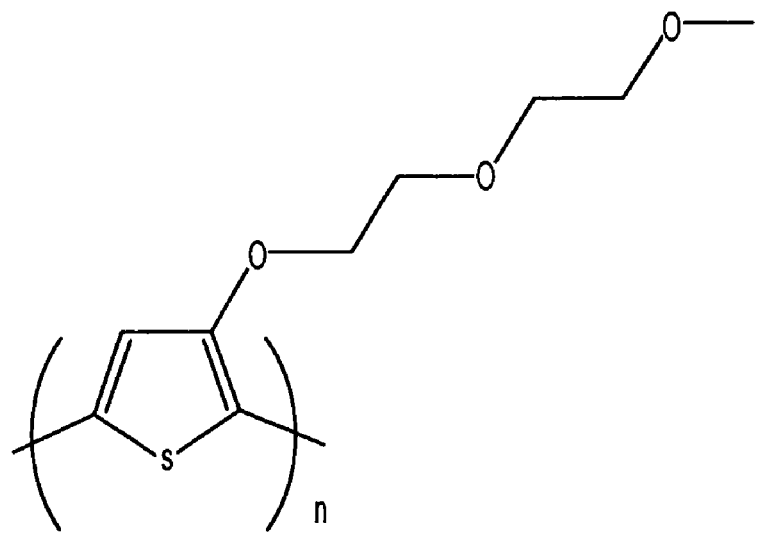
Figure 5:
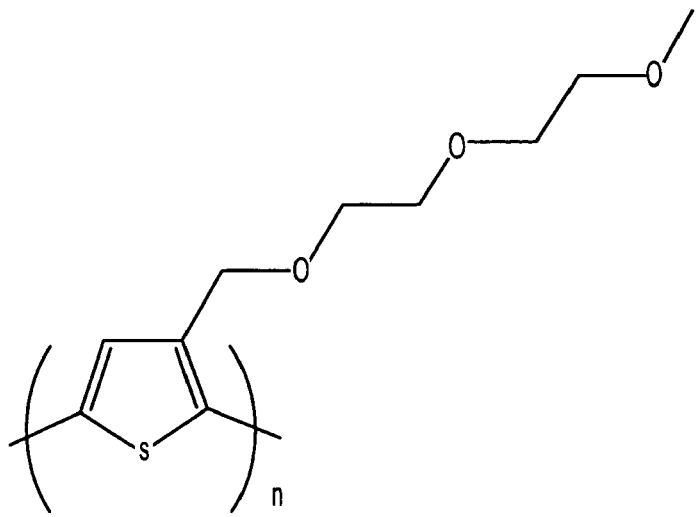
Figure 6A:
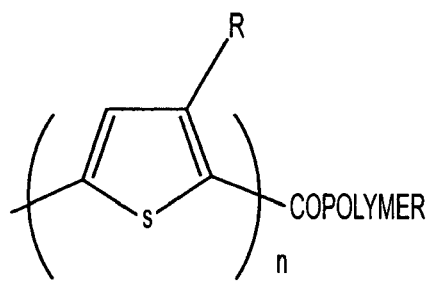
Figure 6B:
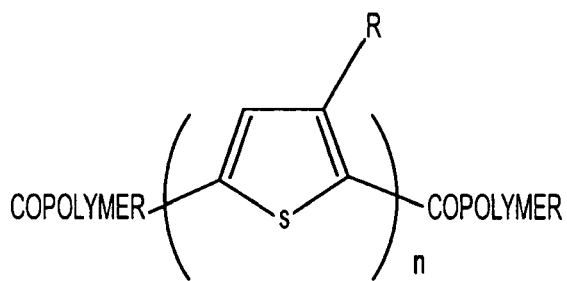

In the nomenclature described below for substitution sites for a heteroatom, the two systems can be used equivalently: (1) α, β, γ, etc. is equivalent to (2) 1, 2, 3, etc.

Diodes

Diodes are described in, for example, Ben G. Streetman, *Solid State Electronic Devices*, $4^{th}$ Ed., 1995 including in particular chapter 5 on "junctions", page 130-200 and chapter 6 on "p-n Junction Diodes", pages 201-231, which are hereby incorporated by reference in their entirety. This reference describes, for example, fabrication of junctions and diodes. In one type of diode, a p-type material is placed against an n-type of material. Examples of semiconductor junction types of diodes include normal p-n diodes, gold doped diodes, zener diodes, avalanche diodes, transient voltage suppression (TVS) diodes, light-emitting diodes (LEDs), photodiodes, Schottky diodes, snap diodes, esaki or tunnel diodes, and gunn diodes. Other types of diodes include point contact diodes, tube or valve diodes, gas discharge diodes, and varicap or varactor diodes. One skilled in the art can prepare non-light emitting diodes.

The use of polymers in diodes had been described in US Patent Applications 2004/0140759, 2003/0129784 and 2003/0054579 and U.S. Pat. Nos. 6,794,676, 6,509,581, 6,313,261, 6,124,046 and 5,237,582.

Additional technology background with respect to diodes and regioregular polymers includes, for example, U.S. Pat. Nos. 6,808,972; 6,806,374; 6,750,473; 6,736,985; 6,676,857; 6,626,566; 6,608,323; 6,603,139; 6,545,291; 6,506,438; 6,468,759; 6,437,422; 6,429,040; 6,403,809; 6,384,804; 6,376,828; 6,361,885; 6,340,789; 6,197,663; 6,165,383; 6,150,668; and 6,025,462.

These references describe p-type and n-type materials including, for example n-doped silicon which can be doped by doping agents and methods known in the art including, for example, arsenic, phosphorous, and antimony as known in the art. Both group IV and groups III-V and II-VI can be used. Organic semiconductors can be used including low molecular weight and high molecular weight materials. Nanostructures can be used including nanowires, nanoparticles, quantum dots, and nanotubes. Methods known in the art can be used to prepare electron rich and electron poor materials, which are designed to make contact with each other and form a junction. The amount of doping can be controlled by methods known in the art. Examples of extrinsic, elemental semiconductor materials include Si doped with B, Al, Ga, P, As, Sb; as well as Ge doped with Al, Ga, In, As, and Sb. See, for example, W. R. Runyan et al., *Handbook of Materials and Processes for Electronics*, 1970. Intrinsic semiconductors can be used including for example BP, AlSb, GaP, GaAs, GaSb, InP, InAs, InSb, ZnS ZnSe, ZnTe, CdS, CdSe, CdTe, HgSe, and HgTe. They can be used with or without doping. Semiconductors can be crystalline or amorphous.

In addition to diode's ability to convert electrical current into light emission, or vice versa, other types of diodes are also important which do not have these properties. In other words, the materials and geometry are designed so that any light emission cannot be seen. The diodes can be non-light emitting diodes. The diodes can be non-photovoltaic diodes.

Figure 7A:
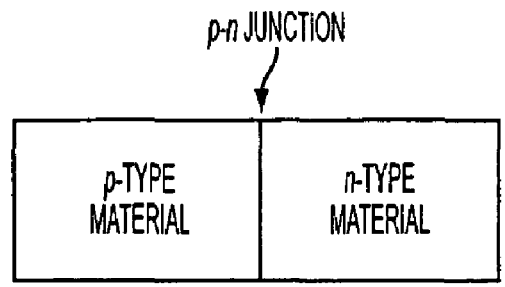
FIG. 7 illustrates (a) a solid-state rectifier, or diode, which contains a single p-n junction; (b) in reverse bias, polarization occurs and little current flows; (c) in forward bias, majority carriers in each region flow toward the junction, where they are continuously recombined.
Figure 7B:
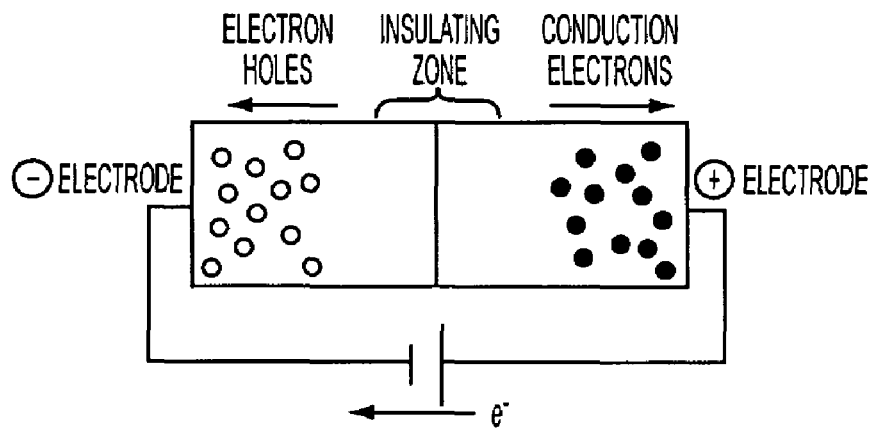
Figure 7C:
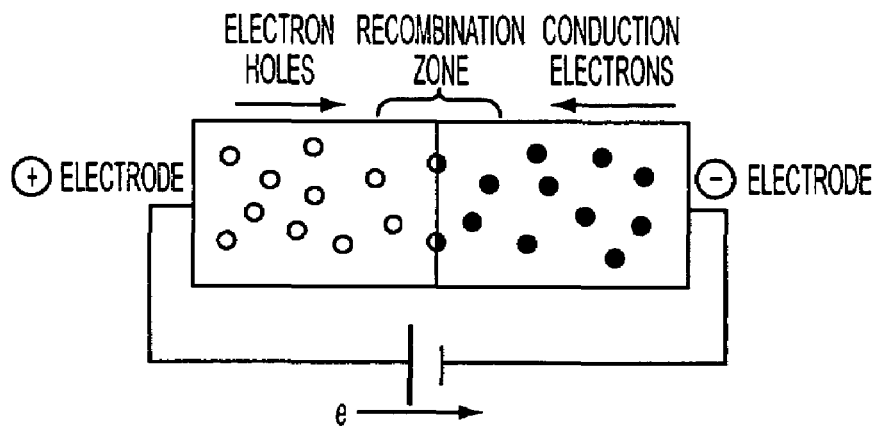
Figure 8:
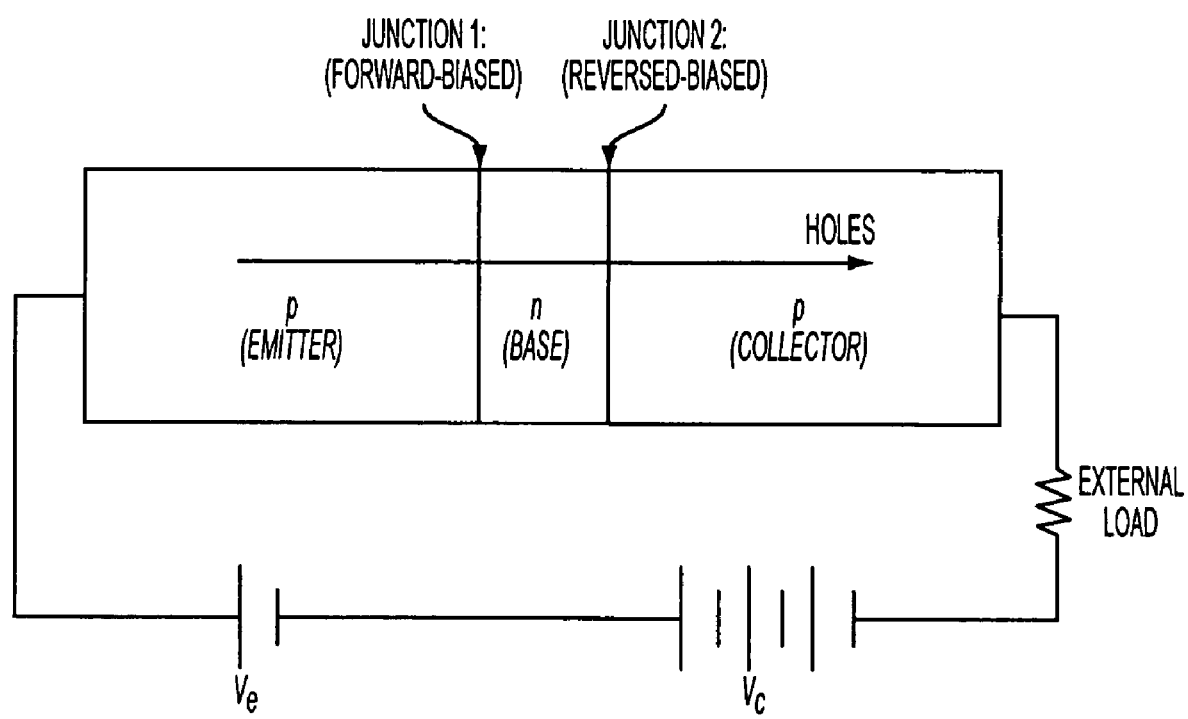
FIG. 8 illustrates a schematic of a transistor (a p-n-p sandwich). The overshoot of electron holes across the base (n-type region) is an exponential function of the emitter voltage Ve. Because the collector current (Ic) is similarly an exponential function of Ve, this device serves as an amplifer. An n-p-n transistor functions similarly except that electrons rather than holes are the overall current source.
Figure 9:
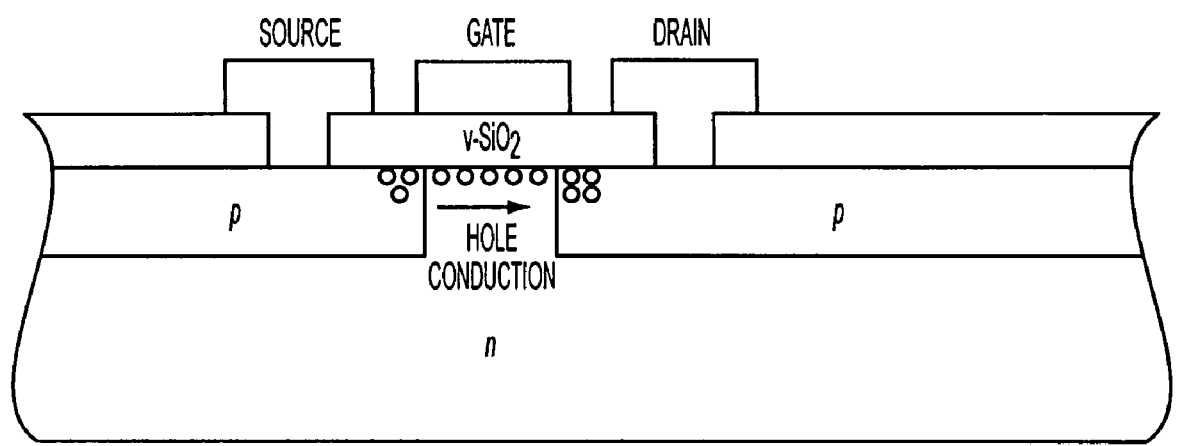
FIG. 9 illustrates schematic of a field-effect transistor (FET). A negative voltage applied to the gate produces a field under the vitreous silica layer and a resulting p-type conductive channel between the source and the drain. The width of the gate can be typically about one micron.

FIGS. 7, 8, and 9 also describe junctions according to the present invention.

Diodes can be fabricated by methods known in the art. For example, a p-n junction can be fabricated by (i) providing a p-type material, (ii) providing an n-type material, and (iii) combining the p-type material and the n-type material so that they contact each other by methods known in the art. See for example FIG. 7. The p-type material can be the heteroatomically substituted regioregular polythiophene as described herein.

Similarly, an additional step can be provided for providing an additional p-type material and combining it with the p-n junction to provide a p-n-p sandwich structure as shown in FIG. 8.

Transistors can be fabricated. See, for example, FIG. 9.

Conjugated Polymers Generally in Thin Films

Highly conductive thin films of soluble, inherently conductive poly(thiophenes) are useful in a variety of applications, including the diodes according to the present invention. In their neutral or undoped form, soluble conductive polymers such as poly(3-substituted thiophenes) offer the ability to be applied by spin casting, drop casting, screening, ink-jetting, and standard printing techniques such as transfer or roll coating. Conductivity can be tuned from the neutral or semi-conductive state to a highly conductive state depending upon the amount of dopant added, making the material specifically suitable for a given application. Generally speaking, conductive films of doped poly(thiophenes) can be made transparent in the visible region. This makes them suitable for use as transparent conductors.

This combination of properties makes them suitable for use in electronic devices such as diodes and light emitting diodes, including the diodes of the present invention.

Conductive polymers, in particular doped polythiophenes, have been shown to function suitably as positive charge carriers, also known as hole injection layers, in diodes as well as in light emitting diodes and solid-state lighting. This is a function of their facile oxidation as well as their stability in the doped state. A commercial example of this type of application is poly(3,4-ethylenedioxythiophene), which is available from H. C. Stark. This material has limited applicability in that it is synthesized in an oxidized form, low in pH, and insoluble. It is only available as an aqueous dispersion.

Performance of conductive thin films is gauged by evaluation of their high electrical conductivity value, good electrical performance, and high thermal stability. Conductivity is typically measured by:

$$\sigma = I/(4.53\ VW)$$

Where conductivity, $\sigma$, is measured in S/cm, I=current, amps, V=voltage, V, and W=film thickness in cm. Typically this value is measured by the standard, four point probe method, wherein current is passed between two electrodes and potential is measured through another pair of electrodes. Thickness can be determined by various methods such as SEM and profilometry.

The use of soluble conductive polymers, such as poly(3-alkylthiophenes), to build conductive layers or films offers in diodes several advantages such as ease of processability of materials and components during device production. In their neutral or undoped form, conductive polymers offer the ability to use spin casting, drop casting, screening, ink-jetting, and standard printing techniques such as transfer or roll coating to apply the conductive polymer layer. These methods allow for facile in-situ processing and precise control over the volume of conductive material applied. In general, methods can be used which are used for printable or printed electronics. Microlithography and nanolithography methods can be used.

The use of regio-regular poly(3-heteroatomic substituted thiophenes) offer several advantages in this application. Paramount among these advantages is the ability to tune the conductivity of the device through control of the morphology of the film, the selection of oxidant used, and the amount of oxidant used. As these materials are formed in the neutral or undoped state, conductivity may be carefully tuned by the amount of oxidation. Another key benefit of the use of these materials when compared to the use of other conducting polymers is the stability of the oxidized or "doped" conductive state of the poly(3-heteroatomic substituted thiophene). The selective solubility of these materials also allows for selective application and removal of films of these materials in devices.

In addition, electrically conductive polymers are described in *The Encyclopedia of Polymer Science and Engineering*, Wiley, 1990, pages 298-300, including polyacetylene, poly(p-phenylene), poly(p-phenylene sulfide), polypyrrole, and polythiophene, which is hereby incorporated by reference in its entirety. This reference also describes blending and copolymerization of polymers, including block copolymer formation.

Polythiophene

The below description about polythiophene can be used in the practice of the present invention including in the diodes of the present invention. It has been shown that, like other conjugated polymers, poly(thiophene) has a conjugated π-electron band structure that, upon oxidation, makes it a suitable organic conductor. Poly(thiophenes) can be prepared by various chemical and electrochemical transformations of suitably susbstituted thiophenes that result, primarily in the coupling of the thiophene rings at the 2- and 5- positions of the monomer. The degree of other modes of coupling of these thiophene moieties depends on the method employed and can afford polymers and/or oligomers of varying structural homogeneity. Syntheses of polythiophenes employ methods where the polymer exhibits nearly 100% of these 2- to 5-couplings, and embues the polymer with beneficial structural features as detailed below.

Performance of these materials as a conductor is increased when they are doped, or oxidized. Upon oxidation, or "doping," electrons are removed from the valence band. This change in oxidation state results in the formation of new energy states, called bipolarons. The energy levels are accessible to some of the remaining electrons in the valence band, allowing the polymer to function as a conductor. The extent of this conjugated structure is dependent upon the ability of the polymer chains to form a planar conformation in the solid state. This is because conjugation from ring-to-ring is dependent upon π-orbital overlap. If a particular ring is twisted out of planarity, the overlap cannot occur and the conjugation band structure can be lost. Some minor twisting is not detrimental since the degree of overlap between thiophene rings varies as the cosine of the dihedral angle between them.

Performance of a conjugated polymer as an organic conductor is also dependant upon the morphology of the polymer in the solid state. Electronic properties are dependent upon the electrical connectivity and inter-chain charge transport between polymer chains. Pathways for charge transport can be along a polymer chain or between adjacent chains. Transport along a chain requires a planar backbone conformation due to the dependence of the charge carrying moiety on the amount of double-bond character between the rings. This conduction mechanism between chains requires either a stacking of planar, polymer segment, called π-stacking, or an inter-chain hopping mechanism in which excitons or electrons can tunnel or "hop" through space or another matrix to another chain that is in proximity to the one that it is leaving. Therefore, any process that can drive ordering of polymer chains in the solid state helps to improve the performance of the conducting polymer. It is known that the absorbance characteristics of thin films of polythiophenes reflect the increased π-stacking which occurs in the solid state.

To effectively use a conjugated polymer as an organic conductor for this application, it is preferably prepared by a method that allows the removal of organic and ionic impurities from the polymeric matrix. The presence of impurities, notably metal ions, in this material may have deleterious effects on performance. There are several methods by which impurities may be removed from a conjugated polymer. Most of these are facilitated by the ability to dissolve the polymer in common organic and polar solvents. Unfortunately, poly(thiophene) is, essentially, insoluble Substituted Polythiophenes The below description about substituted polythiophene can be used in the practice of the present invention including in the diodes of the present invention.

It has been shown that some poly(3-substitutedthiophenes) with alkyl, aryl, and alkyl-aryl substituents are soluble in common organic solvents such as tetrahydrofuran (THF), chloroform, toluene and xylene. These materials share a common conjugated π-electron band structure, similar to that of poly(thiophene) that, upon doping, make them suitable organic conductor for use in applications requiring highly conductive thin films, but due to their solubility they are much easier to process and purify than poly(thiophene). These materials can be made as oligomer chains such as (3-alkythiophene)$_n$, (3-arlythiophene)$_n$, or (3alkyl/arylthiophene)$_n$ in which n is the number of repeat units with a value of 2-10 or as polymers in which n=11-350 and higher, but for these materials n most typically has a value of 50-200.

However, adding a 3-substituent to the thiophene ring makes the thiophene repeat unit asymmetrical. Polymerization of a 3-substituted thiophene by conventional methods results in 2,5'-couplings, but also in 2,2'- and 5,5'-couplings. The presence of 2,2'-couplings or a mixture of 2,5'-, 2,2'- and 5,5'-couplings can result in steric interactions between 3-substituents on adjacent thiophene rings which can create a tortional strain. The rings then rotate out of a planar conformation to another, thermodynamically more stable, conformation which minimizes the steric interactions from such couplings. This new conformation can include structures where π-overlap is significantly reduced. This results in reduction of π-orbital overlap between adjacent rings, and if severe enough, the net conjugation length decreases and with it the conjugated band structure of the polymer. The combination of these effects impairs the performance as suitable and stable conductor.

Regioregular Poly(thiophene) Materials

The below description about regioregular polythiophene can be used in the practice of the present invention including in the diodes of the present invention.

Materials with superior π-conjugation, electrical communication, and solid state morphology can be prepared by using regiospecific chemical coupling methods that produced >95% 2,5'-couplings of poly(3-substituted thiophenes) with alkyl substituents. These materials have been prepared via the use of a Kumada-type nickel-catalyzed coupling of a 2-bromo-5- magneisiobromo-3-substitutedthiophene as well as by the zinc coupling of a 2-bromo-5-thienylzinc halide which has been reported by Reike. A more practical preparative synthesis of a regio-regular poly (3-substitutedthiophene) with alkyl substituents was affected by the Grignard metathesis of a 2,5-dibromo-3-alkylthiophene, followed by nickel cross coupling.

Like regio-random poly(3-substitutedthiophenes) with alkyl, aryl, and alkyl/aryl substituents, regio-regular poly(3-substitutedthiophenes) with alkyl, aryl, and alkyl/aryl substituents are soluble in common organic solvents and demonstrate enhanced processability in applications by deposition methods such as spin-coating, drop casting, dip coating, spraying, and printing techniques (such as ink-jetting, off-setting, and transfer-coating). Therefore, these materials can be better processed in large-area formats to regio-random poly(3-substitutedthiophenes). Furthermore, because of the homogeneity of their 2,5'-ring-to-ring couplings, they exhibit evidence of substantial π-conjugation and high extinction coefficients for the absorption of visible light corresponding to the π- π* absorption for these materials. This absorption determines the quality of the conducting band structure which may be utilized when a regioregular poly(3-substituted thiophene) with alkyl, aryl, or alkyl/aryl substituents is, upon doping, used as in applications requiring highly conductive thin films.

Another benefit of the regio-regularity of these materials is that they can self-assemble in the solid state and form well-ordered structures. These structures tend to juxtapose thiophene rings systems through a π-stacking motif and allow for improved inter-chain charge transport through this bonding arrangement between separate polymers, enhancing the conductive properties when compared to regio-random polymers. Therefore, one can recognize a morphological benefit to these materials.

As is the case with the use of poly(thiophene) in applications requiring highly conductive thin films, the presence of impurities, notably metal ions, in this material may have serious deleterious effects on the performance of poly-thiophene-containing devices. There are several methods by which impurities may be removed from a conjugated polymer. Most of these are facilitated by the ability to dissolve the polymer in common organic and polar solvents. The solubility of these materials facilitates their purification such that they can be made suitable for their application upon doping.

These materials can be made as oligomer chains such as (3-alkythiophene)$_n$, (3-arlythiophene)$_n$, or (3-alkyl/arylthiophene)$_n$ in which n is the number of repeat units with a value of 2-10 or as polymers in which n=11-350 and higher, but for these materials n most typically has a value of 50-200. In another embodiment, the polymer can comprise less than 80 thiophene repeat units.

Heterosynthesis

Synthetic methods, doping, and polymer characterization, including regioregular polythiophenes with heteroatoms in the side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mat.*, 10, No. 2, pages 93-116, and references cited therein, which is hereby incorporated by reference in its entirety. In particular, section 4 describes "Chemical Synthesis of Heteroatomic Functionalized Substituents on PTs: Recognition Sites for Self-Assembly and Chemical Sensing." Another reference which one skilled in the art can use is the *Handbook of Conducting Polymers*, 2$^{nd}$ Ed., 1998, Chapter 9, by McCullough et al., "Regioregular, Head-to-Tail Coupled Poly(3-alkylthiophene) and its Derivatives," pages 225-258, which is hereby incorporated by reference in its entirety. In particular, section VI describes heteroatomic substituents on HT PATs including ether groups and thioalkyl groups.

U.S. Pat. No. 6,602,974 to McCullough describes conducting regioregular polythiophene block copolymers, including diblock and triblock types, which include as non-thiophene component, for example, polyolefins such as poly(meth)acrylates, polystyrene, and polymethylmethacrylates, and polyurethane elastomers.

Provisional patent application No. 60/612,641 filed Sep. 24, 2004, "Heteroatomic Regioregular Poly(3-Substitutedthiophenes) in Photovoltaic Cells" is hereby incorporated by reference in its entirety, describing applications for conducting polymers in photovoltaic cells.

Provisional patent application No. 60/612,640 filed Sep. 24, 2004, "Heteroatomic Regioregular Poly(3-Substitutedthiophenes) in Electroluminescent Devices" is hereby incorporated by reference in its entirety, describing applications for conducting polymers in electroluminescent devices.

Heteroatom-substituted with alpha substitution doped polythiophenes according to the invention can function suitably as positive charge carriers, also known as hole injection layers, in diodes as well as in light emitting diodes and solid-state lighting. This is a function of their facile oxidation as well as their stability in the doped state, and is an advantage over alkyl-substituted or non-substituted polythiophenes.

Oxygen in Alpha Position

Regio-regular poly(3-substitutedthiophenes) with alkyl, aryl, and alkyl/aryl substituents and an oxygen atom in the α-position of the 3-substituent has also been prepared by the McCullough (nickel cross-coupling of 2-bromo-5-(magnesiobromo)-3-(alkoxythiophene)) and GRIM (Grignard metathesis of a 2,5-dibromo-3-(alkoxythiophene) followed by a nickel cross-coupling reaction) methods. Specific examples of this class of materials include poly(3-substitutedthiophenes) with 1-oxaheptyl and 1,4,7-trioxaoctyl substituents. In some instances, the 3-substitutent may contain a heteroatom other than oxygen (e.g, S) in addition to an oxygen atom in the α-position. The amount of regio-regular 2,5'-couplings for these materials exceeds 95%.

Regio-regular poly(3-substitutedthiophenes) with alkyl, aryl, and alkyl/aryl substituents and an oxygen atom in the α-position of the 3-substituent demonstrate the same enhanced performance as other regio-regular poly(3-substituted) thiophenes with alkyl, aryl, and alkyl/aryl with regard to processability, defect-free electronic structure, high extinction coefficient, high electronic mobility, and improved solid-state morphology. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allowing the selective dissolution of this layer in the presence of other device components.

As is the case with the use of doped poly(thiophene) in conductive thin-film applications, the presence of impurities, notably metal ions, in this material may have serious deleterious effects on the performance of polythiophene-containing devices. There are several methods by which impurities may be removed from a conjugated polymer. Most of these are facilitated by the ability to dissolve the polymer in common organic and polar solvents. The solubility of these materials facilitates their purification such that they can be made suitable for a given application.

These materials can be made as oligomer chains such as (3-alkoxythiophene)$_n$, (3-aryloxythiophene)$_n$, or (3alkyl/aryloxythiophene) in which n is the number of repeat units with a value of 2-10 or as polymers in which n=11-350 and higher, but for these materials n most typically has a value of 50-200. In another embodiment, the polymer can comprise less than 80 thiophene repeat units.

Oxygen in Beta Position

Regio-regular poly(3-substitutedthiophenes) with alkyl, aryl, and alkyl/aryl substituents and an oxygen atom in the β-position of the 3-substituent have also been prepared by the McCullough (nickel cross-coupling of 2-bromo-5-magnesiobromo-3-alkoxythiophene) and GRIM (Grignard metathesis of a 2,5-dibromo-3-alkoxythiophene followed by a nickel cross-coupling reaction) methods. Specific examples of this class of materials include poly(3-substitutedthiophenes) with 2,5-dioxahexyl and 2,5,8-trioxanonyl substituents. In some instances, the 3-substituent may contain a heteroatom other than oxygen (e.g. "S") in addition to an oxygen atom in the α-position. The amount of regio-regular 2,5'-couplings for these materials exceeds 95%.

Regio-regular poly(3-substitutedthiophenes) with alkyl, aryl, and alkyl/aryl substituents and an oxygen atom in the β-position of the 3-substituent demonstrate the same enhanced performance as other region-regular poly(3-substituted) thiophenes with alkyl, aryl, and alkyl/aryl with regard to processability, defect-free electronic structure, high extinction coefficient, high electronic mobility, improved solid-state morphology. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allowing the selective dissolution of this layer in the presence of other device components.

As is the case with the use doped poly(thiophene) in conductive thin-film applications, the presence of impurities, notably metal ions, in this material may have serious deleterious effects on the performance of polythiophene-containing devices. There are several methods by which impurities may be removed from a conjugated polymer. Most of these are facilitated by the ability to dissolve the polymer in common organic and polar solvents. The solubility of these materials facilitates their purification such that they can be made suitable a given application.

These materials can be made as oligomer chains such as (3-β-oxathiophene)$_n$, (3-β-oxaarylthiophene)$_n$, or (3-β-oxaalkyl/arylthiophene)$_n$ in which n is the number of repeat units with a value of 2-10 and or as polymers in which n=11-350 and higher, but for these materials n most typically has a value of 50-200. In another embodiment, the polymer can comprise less than 80 thiophene repeat units.

Heteroatom in Alpha Position

Regio-regular poly(3-substituted thiophenes) with alkyl, aryl, and alkyl/aryl substituents and a hetero atom in the α-position of the 3-substituent has also been prepared by the McCullough (nickel cross-coupling of 2-bromo-5-magnesiobromo-3-α-heteroalkylthiophene) and GRIM (Grignard metathesis of a 2,5-dibromo-3-α-heteroalkylthiophene) followed by a nickel cross-coupling reaction) methods. Specific examples of this class of materials include poly(3-substituted thiophenes) with 1-thiaheptyl substituent. In some instances, the 3-substitutent may contain a heteroatom other than heteroatom in addition to a hetero atom in the α-position. The amount of regio-regular 2,5'-couplings for these materials exceeds 95%.

Regio-regular poly(3-substitutedthiophenes) with alkyl, aryl, and alkyl/aryl substituents and a hetero atom in the α-position of the 3-substituent demonstrate the same enhanced performance as other region-regular poly(3-substituted) thiophenes with alkyl, aryl, and alkyl/aryl with regard to processability, defect-free electronic structure, high extinction coefficient, high electronic mobility, improved solid-state morphology. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allowing the selective dissolution of this layer in the presence of other device components.

As is the case with the use of doped poly(thiophene) in conductive thin-film applications, the presence of impurities, notably metal ions, in this material may have serious deleterious effects on the performance of polythiophene-containing devices. There are several methods by which impurities may be removed from a conjugated polymer. Most of these are facilitated by the ability to dissolve the polymer in common organic and polar solvents. The solubility of these materials facilitates their purification such that they can be made suitable for a given application.

These materials can be made as oligomer chains such as (3-α-heteroalkylthiophene)$_n$, (3-α-heteroarylthiophene)$_n$, or (3-α-heteroalkyl/arylthiophene)$_n$ in which n is the number of repeat units with a value of 2-10 or as polymers in which n=11-350 and higher, but for these materials n most typically has a value of 50-200. In another embodiment, the polymer can comprise less than 80 thiophene repeat units.

Heteroatom in Beta Position

Regio-regular poly(3-substitutedthiophenes) with alkyl, aryl, and alkyl/aryl substituents and a hetero atom in the β-position of the 3-substituent has also been prepared by the McCullough (nickel cross-coupling of 2-bromo-5-magnesiobromo)-3-β-heteroalkylthiophene) and GRIM (Grignard metathesis of a 2,5-dibromo-3-β-heteroalkylthiophene) followed by a nickel cross-coupling reaction). Specific examples of this class of materials include poly(3-substitutedthiophenes) with β-thiaoctyl substituent. In some instances, the 3-substitutent may contain a heteroatom other than the heteroatom in the β-position. The amount of regio-regular 2,5'-couplings for these materials exceeds 95%.

Regio-regular poly(3-substitutedthiophenes) with alkyl, aryl, and alkyl/aryl substituents and a hetero atom in the β-position of the 3-substituent demonstrate the same enhanced performance as other region-regular poly(3-substituted) thiophenes with alkyl, aryl, and alkyl/aryl with regard to processability, defect-free electronic structure, high extinction coefficient, high electronic mobility, improved solid-state morphology. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allowing the selective dissolution of this layer in the presence of other device components.

As is the case with the use of doped poly(thiophene) in conductive thin-film applications, the presence of impurities, notably metal ions, in this material may have serious deleterious effects on the performance of polythiophene-containing devices. There are several methods by which impurities may be removed from a conjugated polymer. Most of these are facilitated by the ability to dissolve the polymer in common organic and polar solvents. The solubility of these materials facilitates their purification such that they can be made suitable for their application in a given application These materials can be made as oligomer chains such as (3-β-heteroalkylthiophene)$_n$, (3-β-heteroarylthiophene)$_n$, or (3-β-heteroalkyl/arylthiophene)$_n$ in which n is the number of repeat units with a value of 2-10 or as polymers in which n=11-350 and higher, but for these materials n most typically has a value of 50-200. In another embodiment, the polymer can comprise less than 80 thiophene repeat units.

Doping

The use of a regio-regular poly(3-substitutedthiophene) in which the 3-substitutent is an alkyl, aryl, or alkyl/aryl moiety with an oxygen substitution in either the α or β-position of the 3-substituent or a hetero atom in either the α- or β-position of the 3-substituent as well as copolymers of these materials in conductive thin-film applications, involves a controlled oxidation or "doping" of the polymer to obtain the desired conductive state that is necessary for performance. Upon oxidation, electrons are removed from the valence band. This change in oxidation state results in the formation of new energy states, called bipolarons. The energy levels are accessible to some of the remaining electrons in the valence band, allowing the polymer to function as a conductor.

In a conductive thin-film application, the conductivity can range from about $1 \times 10^{-8}$ S/cm to about $10^4$ S/cm but most typically it is in the range of about 1 S/cm to about 500 S/cm. In the case of regio-regular poly(3-substituted thiophenes) in which the 3-substitutent is an alkyl, aryl, or alkyl/aryl moiety with an oxygen substitution in either the α- or β-position of the 3-substituent or a hetero atom in either the α- or β-position of the 3-substituent, the important characteristics of the conductive thin film are that they retain their conductivity for thousands of hours under normal use conditions and meet suitable device stress tests at elevated temperatures and/or humidity. This facilitates an operational range of robust charge mobility and allows the tuning of properties by controlling the amount and identity of the doping species and complements the ability to tune these properties by the tuning of the primary structure.

There are many oxidants which may be used to tune conductive properties. Molecular halogens such as bromine, iodine, and chlorine offer some advantages. By controlling the amount of exposure of the dopant to the polymer the resulting conductive thin film can be controlled. Because of their high vapor pressure and solubility in organic solvents, halogens may be applied in the gas phase or in solution. Oxidation of the polymer greatly reduces the solubility of the material relative to that of the neutral state. Nevertheless, some solutions may be prepared and coated onto devices.

Other examples include iron trichloride, gold trichloride, arsenic pentafluoride, alkali metal salts of hypochlorite, protic acids such as benzenesulfonic acid and derivatives thereof, proprionic acid, and other organic carboxylic and sulfonic acids, nitrosonium salts such as $NOPF_6$ or $NOBF_4$, or organic oxidants such as tetracyanoquinone, dichlorodicyanoquinone, and hypervalent iodine oxidants such as iodosylbenzene and iodobenzene diacetate. Polymers may also be oxidized by the addition of a polymer that contains acid or oxidative functionality such as poly(styrene sulfonic acid).

Some Lewis acid oxidants such as iron trichloride, gold trichloride, and arsenic pentafluoride have been used to dope poly(3-substituted thiophenes) via a redox reaction. These dopants have been reported to result in the formation of stable, conductive films. This is primarily accomplished through the treatment of the cast film to a solution of the metal chloride, albeit the casting of doped films is possible but is rarely reported Protic organic and inorganic acids such as benzenesulfonic acid and derivatives thereof, proprionic acid, other organic carboxylic and sulfonic acids, and mineral acids such as nitric, sulfuric and hydrochloric can be used to dope poly(3-substituted thiophenes).

Nitrosonium salts such as $NOPF_6$ and $NOBF_4$ can be used to dope poly(3-substitutedthiophenes) by a reaction which produces the stable nitric oxide molecule in an irreversible redox reaction.

Organic oxidants such tetracyanoquinone, dichlorodicyanoquinone, and hypervalent iodine oxidants such as iodosylbenzene and iodobenzene diacetate have been used to dope poly(3-substituted thiophenes).

Applications of Conductive Thin Films in Diodes

In this invention, we describe the use of a regio-regular poly(3-substitutedthiophene) in which the 3-substitutent is an alkyl, aryl, or alkyl/aryl moiety with an heteroatomic oxygen or sulfur substitution in either the α- or β-position of the 3-substituent; or a heteroatom in either the α- or β-position of the 3-substituent; as well as copolymers of these materials as conductive thin films for various diode applications including non-light emitting diode applications. In addition to the conductive polymers described herein, conventional p-type and n-type materials known in the art, including known inorganic, semiconductor, and polymeric type materials can be used in conjunction with the conductive polymers to form the junction.

In this invention, copolymers of these materials can be understood as a homo-, block-, alternating-, graft- and random-copolymers of which incorporate one or more of the materials defined as a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent with blocks composed of polymers built from unsaturated monomers such as —$CH_2CH$ Ar—, where Ar=any aryl or functionalized aryl group, isocyanates, ethylene oxides, conjugated dienes, $CH_2CHR_1R$ (where $R_1$=alkyl, aryl, or alkyl/aryl functionality and R═H, alkyl, Cl, Br, F, OH, ester, acid, or ether), lactam, lactone, siloxanes, and ATRP macroinitiators.

In this invention, the copolymer also can be understood as a random or well-defined copolymer a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent with a block comprised of one or more functionalized thiophene derivatives, or as a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as a copolymer with random or well-defined copolymer comprised of one or more thiophene units. In the case of regio-regular copolymer of thiophene derivatives, the comonomers may contain alkyl, aryl, alkyl-aryl, fluoro, cyano, or a substituted alkyl, aryl, or alkyl-aryl functionality in either the 3- or 4-position of the thiophene ring.

In this invention, a copolymer can be a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent with blocks of random or well-defined polymer comprised of one or more functionalized oligothiophenes which is also random or well defined.

In this invention, a copolymer can be a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent is an alternating copolymer with an ethylene derivative, commonly described as "thiophene vinylene" copolymer.

In this invention a poly(3-substituted thiophene) with heteroatomic substitutents in the α- or β-position of the 3-substitutent may also contain a substitutent in the 4-position with alkyl, aryl, alkyl-aryl, fluoro, cyano, or a substituted alkyl, aryl, or alkyl-aryl functionality.

Copolymers described in the aforementioned U.S. Pat. No. 6,602,974 patent to McCullough et al. are preferred examples. Copolymers, including block copolymers, comprising both regioregular polythiophene units together with a synthetic organic polymer unit are preferred.

In this invention we describe a conductive thin film as a doped film of an inherently conductive polymer that is about 10 nm to about 50 µm in thickness with typical thickness ranging from about 50 nm to about 1 µm. In another embodiment, thickness can be about 10 nm to about 500 nm, and more particularly, about 10 nm to about 100 nm.

EMBODIMENTS

An embodiment of this invention is a conductive thin film comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials in which the polymer has been doped with bromine, iodine, chlorine, iron trichloride, gold trichloride, arsenic pentafluoride, a protic acid, nitrosonium salts such as $NOPF_6$ or $NOBF_4$, or organic oxidants in a diode.

A second embodiment of this invention is a conductive thin film in a diode that is comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials in which the polymer has been doped with bromine, iodine, chlorine, iron trichloride, gold trichloride, arsenic pentafluoride, a protic acid, nitrosonium salts such as $NOPF_6$ or $NOBF_4$, or organic oxidants that is used as a component of a light emitting device (or LED).

A third embodiment of this invention is a conductive thin film in a diode that is comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials in which the polymer has been doped with bromine, iodine, chlorine, iron trichloride, gold trichloride, arsenic pentafluoride, a protic acid, nitrosonium salts such as $NOPF_6$ or $NOBF_4$, or organic oxidants that is used as a component of solid-state lighting.

In this invention good performance of an conductive thin film comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers is achieved only if the contamination of the conductive polymer with metallic impurities and other impurities does not exceed about 1,000 ppm, or more particularly, does not exceed about 500 ppm. Impurity levels can be measured by atomic absorption spectroscopy and other methods known in the art.

Other embodiments of the present invention can be made and used in accordance with U.S. Pat. Nos. 6,602,974 and 6,166,172.

The following represent additional preferred embodiments of the invention which can be practiced by one skilled in the art:

1) The use of a regio-regular poly(3-substitutedthiophene) in which the 3-substitutent is an alkyl, aryl, or alkyl/aryl moiety with an oxygen or sulfur heteroatom substitution in the α-position of the 3-substituent as a conductive thin film in a diode.
2) The use of a regio-regular poly(3-substitutedthiophene) in which the 3-substitutent is an alkyl, aryl, or alkyl/aryl moiety with an oxygen or sulfur heteroatom substitution in the β-position of the 3-substituent as a conductive thin film in a diode.
3) The use of a regio-regular poly(3-substitutedthiophene) in which the 3-substitutent is an alkyl, aryl, or alkyl/aryl moiety with a heteroatom in either the α-position or β-position of the 3-substituent as a conductive thin film in a diode.
4) Embodiment #1, #2 or #3 in which the heteroatom is "S";
5) Embodiments #1-4 such that the regio-regular poly(3-substitutedthiophene) is a copolymer.
6) Embodiment #5 such that the copolymer is a block copolymer.
7) Embodiment #5 such that the copolymer is an alternating copolymer
8) Embodiment #5 such that the copolymer is a random copolymer.
9) Embodiments #6-8 such that the copolymer has a non-thiophene block, and the non-thiophene block is built from $CH_2CH$ Ar, where Ar=any aryl or functionalized aryl group including phenyl (e.g., styrene and polystyrene).
10) Embodiment #9 such that the non-thiophene units are derived from an isocyanate
11) Embodiment #9 such that the non-thiophene units are derived from an ethylene oxides.
12) Embodiment #9 such that the non-thiophene units are derived from a conjugated diene
13) Embodiment #9 such that the non-thiophene units are derived from a lactone
14) Embodiment #9 such that the non-thiophene units are derived from a lactam
15) Embodiment #9 such that the non-thiophene units are derived from a siloxane
16) Embodiment #9 such that the non-thiophene units are derived from $CH_2CH_2R$ where R=Cl, 17) Embodiment #9 such that the non-thiophene units are derived from $CH_2CH_2R$ where R=OH
18) Embodiment #9 such that the non-thiophene units are derived from $CH_2CH_2R$ where R=H
19) Embodiment #9 such that the non-thiophene units are derived from $CH_2CH_2R$ where R=$CH_3$
20) Embodiment #9 such that the non-thiophene units are derived from $CH_2CH_2R$ where R=an alkyl group
21) Embodiment #9 such that the non-thiophene units are derived from $CH_2CH_2R$ where R=F
22) Embodiment #9 such that the non-thiophene units are derived from $CH_2CH_2R$ where R=Br
23) Embodiment #9 such that non-regio-regular poly(3-substitutedthiophene) units are present in the copolymer and are derived from one or more thiophene units.
24) Embodiment #9 such that non-regio-regular poly(3-substitutedthiophene) units are present in the copolymer and are derived from one or more functionalized oligothiophenes which is also random or well defined.
25) Embodiment #9 such that non-regio-regular poly(3-substitutedthiophene) units are present and are derived from one or more functionalized oligothiophenes which is also well defined.
26) Embodiments #5-25 such that the copolymer is an alternating copolymer with a vinylene comonomer
27) Embodiments #1-26 such that the conductive polymer has been doped with an oxidant
28) Embodiment #27 in which the doping agent is bromine
29) Embodiment #27 in which the doping agent is iodine
30) Embodiment #27 in which the doping agent is chlorine
31) Embodiment #27 in which the doping agent is iron trichloride
32) Embodiment #27 in which the doping agent is gold trichloride
33) Embodiment #27 in which the doping agent is arsenic pentafluoride
34) Embodiment #27 in which the doping agent is a protic acid
35) Embodiment #27 in which the doping agent is a nitrosonium salts such as
36) Embodiment #35 in which the nitrosonium salt is $NOPF_6$
37) Embodiment #35 in which the nitrosonium salt is $NOBF_4$
38) Embodiment #27 in which the doping agent is an organic oxidant
39) Embodiments #1-38 in which use in the p-type material, and the contamination of the p-type material with metallic impurities and other impurities does not exceed about 1,000 ppm, and more particularly, about 500 ppm.
40) Embodiments #1-39 comprising fluorine substituted alkyls and aryls including perfluorosubstituted alkyls and aryls.
41) Embodiments #1-40 comprising cyano substituted alkyls and aryls including perfluoronsubstituted alkyls and aryl
42) Embodiments #1-41 such that the conductive thin film is used as a component of a light emitting device or LED.
43) Embodiments according to #5-42, wherein the copolymer comprises portions derived from $CH_2CHR_1R$, wherein R1=alkyl, aryl, or alkyl/aryl functionality and R=H, alkyl, Cl, Br, F, OH, ester, acid, or ether.

All references cited herein are incorporated by reference in their entirety.

The following 61 numbered embodiments were described in priority provisional application 60/628,202 which are hereby incorporated by reference.

1. A diode comprising a conductive thin film which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent.
2. The diode according to 1, wherein the substitution is with oxygen or sulfur.
3. The diode according to 1, wherein the substitution is with oxygen.
4. The diode according to 1, wherein the substitution is with sulfur.
5. The diode according to 1, wherein the substitution is in the alpha position.
6. The diode according to 1, wherein the substitution is in the beta position.
7. The diode according to 1, wherein the substitution is oxygen in the alpha position.
8. The diode according to 1, wherein the substitution is oxygen in the beta position.
9. The diode according to 1, wherein the substitution is a sulfur in the alpha position.
10. The diode according to 1, wherein the polymer is a homopolymer.
11. The diode according to 1, wherein the polymer is a copolymer.
12. The diode according to 1, wherein the polymer is a block copolymer.
13. The diode according to 1, wherein the polymer is an ABA block copolymer.
14. The diode according to 1, wherein the polymer is an AB block copolymer.
15. The diode according to 1, wherein the polymer is an alternating copolymer.
16. The diode according to 1, wherein the polymer is a random copolymer.
17. The diode according to 1, wherein the polymer is a copolymer comprising non-thiophene units.
18. The diode according to 1, wherein the polymer is a block copolymer comprising non-thiophene units.
19. The diode according to 1, wherein the polymer is an alternating copolymer comprising a functionalized thiophene vinylene moiety
20. The diode according to 1, wherein the polymer is mixed with at least one other polymer.
21. The diode according to 1, wherein the polymer is mixed with at least one other polymer which is an intrinsically conductive polymer.
22. The diode according to 1, wherein the polymer comprises non-thiophene units.
23. The diode according to 22, wherein the non-thiophene units comprise aryl or functionalized aryl groups.
24. The diode according to 22, wherein the non-thiophene units comprise urethane or urea linkages.
25. The diode according to 22, wherein the non-thiophene units comprise alkylene oxide units.
26. The diode according to 22, wherein the non-thiophene units comprise ethylenically unsaturated units.
27. The diode according to 22, wherein the non-thiophene units comprise units derived from a lactone or lactam.
28. The diode according to 22, wherein the non-thiophene units comprise siloxane units.
29. The diode according to 22, wherein the non-thiophene units are derived from $CH_2CH_2R$, wherein R is Cl, CN, OH, H, $CH_3$, COOR', alkyl, F, aryl, or Br.
29A. The diode according to 22, wherein the non-thiophene units are derived from $CH_2CHR_1R$, wherein R1=alkyl, aryl, or alkyl/aryl functionality and R=H, alkyl, Cl, Br, F, OH, ester, acid, or ether.

30. The diode according to 22, wherein the non-thiophene units are derived from an ATRP macroinitiator.

31. The diode according to 22, wherein the non-thiophene units are derived from an ATRP polymerizable momomer.

32. The diode according to 1, wherein the polymer is a copolymer which comprises at least two different thiophene units in the polymer chain.

33. The diode according to 1, wherein the polymer is a copolymer which comprises at least two different functionalized thiophene units in the polymer chain.

34. The diode according to 1, wherein the polymer comprises non-poly(3-substitutedthiophene) units derived from one or more thiophene units.

35. The diode according to 1, wherein the polymer comprises non-poly(3-substitutedthiophene) units derived from one or more functionalized thiophene units.

36. The diode according to 1, wherein the polymer comprises non-regio-regular poly(3-substitutedthiophene) units.

37. The diode according to 1, wherein the polymer comprises at least two different types of thiophene monomer units.

38. The diode according to 1, wherein the poly(3-substitutedthiophene) is further substituted at the 4 position.

39. The diode according to 1, wherein the conductive polymer has been doped with a doping agent which is an oxidant.

40. The diode according to 39, wherein the doping agent is bromine, iodine, or chlorine.

41. The diode according to 39, wherein the doping agent is iron trichloride

42. The diode according to 39, wherein the doping agent is gold trichloride

43. The diode according to 39, wherein the doping agent is arsenic pentafluoride 44. The diode according to 39, wherein the doping agent is a protic acid 45. The diode according to 39, wherein the doping agent is a nitrosonium salt.

46. The diode according to 45, wherein the nitrosonium salt is $NOPF_6$ or $NOBF_4$.

47. The diode according to 39, wherein the doping agent is an organic oxidant.

48. The diode according to 1, wherein the thin film has a thickness of about 10 nm to about 50 microns.

49. The diode according to 1, wherein the thin film has a thickness of about 50 nm to about one micron.

50. The diode according to 1, wherein the diode does not provide electroluminescent or photovoltaic properties.

51. A diode comprising a conductive thin film regio-regular poly(3-substitutedthiophene) in which the 3-substituent is an alkyl, aryl, or alkyl/aryl moiety with an oxygen or sulfur substitution in α-position of the 3-substituent.

52. A diode comprising a regio-regular poly(3-substitutedthiophene) in which the 3-substituent is an alkyl, aryl, or alkyl/aryl moiety with an oxygen or sulfur substitution in α-position of the 3-substituent, wherein the diode is not light-emitting.

53. A device comprising a diode comprising a regio-regular poly(3-substitutedthiophene) in which the 3-substituent is an alkyl, aryl, or alkyl/aryl moiety with an oxygen or sulfur substitution in α-position of the 3-substituent, wherein the diode is not light-emitting.

54. A diode consisting essentially of a conductive thin film consisting essentially of at least one polymer comprising a regio-regular poly(3-substitutedthiophene) in which the 3-substituent is an alkyl, aryl, or alkyl/aryl moiety with a heteroatom substitution in either the α- or beta-position of the 3-substituent.

55. A diode consisting essentially of a conductive thin film consisting essentially of regio-regular poly(3-substitutedthiophene) in which the 3-substituent is an alkyl, aryl, or alkyl/aryl moiety with an oxygen or sulfur substitution in α-position of the 3-substituent.

56. A diode consisting essentially of a regio-regular poly(3-substitutedthiophene) in which the 3-substituent is an alkyl, aryl, or alkyl/aryl moiety with an oxygen or sulfur substitution in α-position of the 3-substituent, wherein the diode is not light emitting.

57. A device consisting essentially of a diode consisting essentially of a regio-regular poly(3-substitutedthiophene) in which the 3-substituent is an alkyl, aryl, or alkyl/aryl moiety with an oxygen or sulfur substitution in α-position of the 3-substituent.

58. A diode according to 1, wherein the conductive thin film is applied by spin casting, drop casting, screening, ink-jetting, transfer or roll coating.

59. A diode according to 1, wherein the polymer is a block copolymer comprising one or more blocks derived from an acrylate, unsaturated ester, methyl acrylate, methyl methacrylate or styrene.

60. A diode comprising a p-type material and an n-type material, wherein the p-type material comprises a conductive thin film which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent, wherein the diode is not a light-emitting diode.

61. The diode according to 60, wherein the diode is not a light emitting diode.

What is claimed is:

1. A diode comprising a conductive thin film which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent, wherein the diode does not provide electroluminescent or photovoltaic properties.

2. The diode according to claim 1, wherein the substitution is with oxygen or sulfur.

3. The diode according to claim 1, wherein the substitution is with oxygen.

4. The diode according to claim 1, wherein the polymer is a homopolymer.

5. The diode according to claim 1, wherein the polymer is a copolymer.

6. The diode according to claim 1, wherein the polymer is a block copolymer.

7. The diode according to claim 1, wherein the polymer is an alternating copolymer.

8. The diode according to claim 1, wherein the polymer is a random copolymer.

9. The diode according to claim 1, wherein the conductive polymer has been doped with a doping agent which is an oxidant.

10. The diode according to claim 1, wherein the thin film has a thickness of about 10 nm to about 50 microns.

11. The diode according to claim 1, wherein the thin film has a thickness of about 50 nm to about one micron.

12. A diode according to claim 1, wherein the conductive thin film is applied by spin casting, drop casting, screening, ink-jetting, transfer or roll coating.

13. A diode comprising a p-type material and an n-type material, wherein the p-type material comprises a conductive thin film which comprises at least one polymer comprising a regio-regular poly(3-substitutedthiophene), wherein the diode is not a light-emitting diode.

14. The diode according to claim 13, wherein the diode is also not a photovoltaic diode.

15. The diode according to claim 13, wherein the thin film has a thickness of about 50 nm to about one micron.

16. A diode according to claim 13, wherein the conductive thin film is applied by spin casting, drop casting, screening, ink-jetting, transfer or roll coating.

17. The diode according to claim 13, wherein the 3-substituent is an alkyl, aryl, or alkyl/aryl moiety with a heteroatom substitution in either the α- or beta-position of the 3-substituent, wherein the diode does not provide electroluminescent or photovoltaic properties.

18. A diode comprising a p-type material and an n-type material, wherein the p-type material comprises a conductive thin film which comprises at least one polymer comprising a regio-regular poly(3-substitutedthiophene), wherein the diode is not a photovoltaic diode.

19. The diode according to claim 17, wherein the thin film has a thickness of about 50 nm to about one micron and the conductive thin film is applied by spin casting, drop casting, screening, ink-jetting, transfer or roll coating.

20. The diode according to claim 18, wherein the 3-substituent is an alkyl, aryl, or alkyl/aryl moiety with a heteroatom substitution in either the α- or beta-position of the 3-substituent, wherein the diode does not provide electroluminescent or photovoltaic properties.

* * * * *